United States Patent
Woolf

[19]

[11] Patent Number: 5,872,081
[45] Date of Patent: Feb. 16, 1999

[54] COMPOSITIONS FOR MELT PROCESSING HIGH TEMPERATURE SUPERCONDUCTOR

[75] Inventor: Lawrence D. Woolf, Carlsbad, Calif.

[73] Assignees: General Atomics, San Diego, Calif.; Shimabun Co., Ltd., Kakogawa, Japan

[21] Appl. No.: 418,795

[22] Filed: Apr. 7, 1995

[51] Int. Cl.⁶ .................................................. H01L 39/24
[52] U.S. Cl. ............................ 505/450; 505/452; 427/62
[58] Field of Search .............................. 29/599; 505/450, 505/452; 427/62

[56] References Cited

U.S. PATENT DOCUMENTS

| | | |
|---|---|---|
| 4,826,808 | 5/1989 | Yurek et al. . |
| 4,870,051 | 9/1989 | Maxfield et al. . |
| 4,939,121 | 7/1990 | Rybka . |
| 4,943,557 | 7/1990 | Ling . |
| 4,948,779 | 8/1990 | Keur et al. . |
| 4,983,571 | 1/1991 | Rao et al. . |
| 4,988,673 | 1/1991 | Ferrando . |
| 4,994,437 | 2/1991 | Torii et al. . |
| 4,996,186 | 2/1991 | Wang et al. ............................ 505/450 |
| 5,021,395 | 6/1991 | Druliner et al. . |
| 5,049,542 | 9/1991 | Brass et al. . |
| 5,091,362 | 2/1992 | Ferrando . |
| 5,100,865 | 3/1992 | Yamamoto et al. . |
| 5,100,870 | 3/1992 | Chen et al. ......................... 505/450 X |
| 5,104,849 | 4/1992 | Shiga et al. . |
| 5,108,982 | 4/1992 | Woolf et al. . |
| 5,118,663 | 6/1992 | Woolf et al. . |
| 5,149,681 | 9/1992 | Ohkawa et al. . |
| 5,149,684 | 9/1992 | Woolf et al. . |
| 5,308,799 | 5/1994 | Morita et al. ...................... 505/452 X |
| 5,434,125 | 7/1995 | Ogawa et al. ...................... 505/450 X |
| 5,444,040 | 8/1995 | Kojima et al. ...................... 505/452 X |
| 5,474,976 | 12/1995 | Kondoh et al. ......................... 505/450 |
| 5,496,799 | 3/1996 | Yoshida et al. ......................... 505/450 |
| 5,521,150 | 5/1996 | Murakami et al. ..................... 505/450 |
| 5,547,921 | 8/1996 | Tani et al. ........................... 505/450 X |

OTHER PUBLICATIONS

*Grain growth in monolithic $YBa_2Cu_3O_7$ with high $J_c$*, R.L. Meng et al., Physica C 179, Apr. 19, 1991, pp. 149–158.

*The Crystal Structure and Property of Ternary Compounds and Phase Relations in the System $Yb_2O_3$—$BaO$–$CuO$ at 950°C*, Jingkui Liang et al., Solid State Communications, vol. 74, No. 6, 1990, pp. 509–516.

*Texturing of $YBa_2Cu_3O_{6+x}$ by Melt Processing*, Paul J. McGinn, Weiahu Chen and Naiping Zhu, JOM, Mar. 1991, pp. 26–28.

*Oriented Grain Growth in YBCO Superconductors*, K. Salama and V. Selvamanickam, Supercond. Sci. Technol. 5 (1992), S85–88.

*Processing Techniques for Bulk High–$T_c$ Superconductors*, Sungho Jin, JOM, Mar. 1991, pp. 7–12.

(List continued on next page.)

*Primary Examiner*—Joseph M. Gorski
*Attorney, Agent, or Firm*—Nydegger & Associates

[57] ABSTRACT

A melt processing method for bulk or thick film fabrication of RE123 superconductor material includes the steps of using Nd in the RE123 to increase the recrystallization speed of the RE123, and using a heavy rare earth in the RE123 to establish the peritectic melting point of the RE123 somewhere below the melting point of silver. Within these requirements, the method essentially includes heating the RE123 above its peritectic melting point, and then cooling the resultant decomposed material to recrystallize the RE123. The heavy rare earths to be used for lowering the RE123 peritectic melting temperature include Lu, Yb, Tm or Er or mixtures thereof. The addition of RE211, silver and the use of a low oxygen partial pressure also contribute to a lowering of the melting point of the RE123. When using Nd to accelerate the processing time, the RE123 can include a first component of $Nd_{1-z}R_z123$ and a second component of $Nd_{1-y}R_y211$. For these components, R is one of the heavy rare earths, z is between 0 and approximately 0.9, and y is between 0 and approximately 0.9.

7 Claims, 9 Drawing Sheets

OTHER PUBLICATIONS

*Semisolid Solidification of HTSC Oxides,* Michael J. Cima et al., Journal of Applied Physics, 1992.

*Processing and Fabrication Techniques for Bulk High–$T_c$ Superconductors: A Critical Review,* S. Jin and J.E. Graebner, Materials Science and Engineering B7 (1991), pp. 243–260.

*Millimeter wave surface resistance of grain–aligned $Y_1Ba_2Cu_3O_x$ bulk material,* J. Wosik, R.A. Kranenburg, and J.C. Wolfe, J. Appl. Phys. 69(2), Jan. 15, 1991, pp. 874–877.

*Present Status and Future Prospects in Bulk Processing of High $T_c$ Superconductors,* S. Jin and C.W. Chu, World Scientific, Singapore, 1993, pp. 1–49.

*Thermodynamic Considerations in Superconducting Oxides,* R. Beyers, B.T. Ahn, Materials Science, Nov. 5, 1990, pp. 1–53.

*Structural and Superconducting Properties of $YBa_2Cu_3O_{7-\delta}$ Formed Under Oxygen Pressure Control,* Ienari Iguchi et al., vol. 27, No. 6 Jun., 1988, pp. L992–L995.

*X–ray identification of the superconducting high–$T_c$ phase in the Y–Ba–Cu–O system,* S.B. Qadri et al., The American Physical Society, 1987, Physical Review B, vol. 35, No. 13, pp. 7235–7237.

*Synthesis of Superconductive Oxides by Vacuum Calcination Method,* Naoki Uno et al., Japanese Journal of Applied Physics, vol. 27, No. 6, Jun. 1988, pp. L1003–L1006.

*Low–loss substrate for epitaxial growth of high–temperature superconductor thin films,* R.W. Simon, et al., Appl. Phys. Lett. 53(26), Dec. 26, 1988, pp. 2677–2679.

*Superconducting Perovskites in Microwave Fields,* H. Piel et al., Elsevier Science Publishers B.V., 1988, pp. 1604–1609.

*Partial Melt Growth Process of $Bi_2Sr_2Ca_1Cu_2O_x$ Textured Tapes on Silver,* Jun–ichiro Kase et al., Jun. 13, 1990.

COMPOSITIONS FOR MELT PROCESSING HIGH TEMPERATURE SUPERCONDUCTOR

FIELD OF THE INVENTION

The present invention pertains generally to methods for melt processing RE123 superconductor material. More particularly, the present invention pertains to a melt processing method for RE123 superconductor material which can be accomplished rapidly at temperatures below the melting point of silver. The present invention is particularly, but not exclusively, useful for melt processing methods where the RE123 superconductor material to be fabricated requires relatively long grains and is to be used with a silver cladding or substrate.

BACKGROUND OF THE INVENTION

Any process for fabricating melt processed RE123 superconductor material which can be accomplished more rapidly than presently available methods would be beneficial. Further, because silver (Ag) is known to be an effective, chemically compatible cladding or substrate for $REBa_2Cu_3O_x$ where RE=Y or a rare earth element (RE123), any process for fabricating RE123 in combination with a silver substrate would also be beneficial. To accomplish both objectives with the same fabrication process would be doubly beneficial. Heretofore, however, no such process has been identified.

The fabrication of a high temperature RE123 superconductor material with a silver cladding has much appeal. Indeed, there are several applications for RE123 superconductor material wherein the use of a silver cladding or substrate for the RE123 would be beneficial. These applications include current transport devices, rf and microwave devices, input coils for superconducting quantum interference devices (SQUIDS), and magnetic levitation devices. For example, for the case of the most commonly used Y123, melt processed Y123 has significantly better critical current density and rf surface resistance than sintered (non-melt processed) Y123. Furthermore, since these applications impose different microstructural requirements on the resultant RE123, it is to be appreciated that superconductor performance in these applications will benefit when the resultant RE123 is useable in combination with a silver cladding or substrate. However, when using a melt processing method to fabricate RE123, a process wherein the 123 must be first melted and then cooled, the incorporation of a silver cladding or substrate is only possible by lowering the maximum processing temperature to below that of silver. Unfortunately, it is commonly known in the art that melt processing requires temperatures above the melting point of Ag. The literature even indicates that a heavy rare earth 123 such as Yb123 melts at 1190° C. Silver is the only low cost metal chemically compatible with melt processed 123 (gold is also compatible, but is too expensive). This is why it is important to develop a RE123 melting process below the melting point of silver. During melt processing, the 123 material preferably needs to be on a substrate or in a tube because it has very low strength to keep its shape in the melted state.

To summarize the problems confronted, it is first to be appreciated that a melt process is necessary in order to obtain a high quality 123 superconducting material. The superconducting 123 material, however, needs substrate support during a melt process. It happens that the most compatible materials which can be used with a 123 superconducting material for this purpose include Gold (Au), Yttria stabilized Zirconium Oxide ($ZrO_2$), and Silver (Ag). Of these, Silver has the lowest melting point. Gold and Zirconium Oxide have higher melting points, but they have other drawbacks. Simply stated, gold is very expensive. Zirconium Oxide, though less expensive than gold, has other disadvantages, such as: i) it is available in only small sizes, ii) if the 123 is cooled too slowly during the melt processing, the Zirconium Oxide substrate will adversely react with the 123 superconductor material, and iii) if the 123 is cooled too quickly (e.g. to avoid ii.) the resultant 123 has poorer superconducting qualities. Silver, on the other hand, is readily available in many shapes and sizes and can be incorporated for many different applications. To use Silver, however, it is necessary for the entire melt process to be accomplished at temperatures below the melting point of silver.

Assume for the moment, that the melt processing of RE123 superconductor is accomplished below the melting point of silver, The diverse nature of superconductor materials whose performance can be enhanced by using a silver cladding or substrate will, perhaps, be best appreciated by specifically considering the microstructural requirements for RE123 in some of the specific applications mentioned above. For applications involving the transport of current, a thermal gradient is imposed and a continuous fabrication process is used. The microstructure of the resultant RE123 must then contain a minimal number of grain boundaries and the grain boundaries should be of low angle. There must also be little or no residual Ba-Cu-O non-superconducting material present in general and at the grain boundaries in particular. On the other hand, for applications involving magnetic levitation or low surface resistance rf or microwave applications, large grains of 123 containing finely dispersed 211 phase particles are desired. Some non-superconducting phases at the grain boundaries and high angle grain boundaries do not significantly adversely affect the performance of the material for the magnetic levitation applications.

As implied above, it is well known in the pertinent art that to fabricate RE123 superconductor material, in bulk, it is necessary to melt process the 123 superconductor. This involves heating the material above its peritectic decomposition (melting) temperature and then slowly cooling the material to below that temperature. Above the peritectic decomposition (melting) point, the RE123 material decomposes into a liquid phase containing Ba-Cu and a solid phase containing a composition of $RE_2BaCuO_y$(RE211). Typically, the cooling rate must be approximately 1° C./hr in order for the liquid phase to fully combine with the 211 particles and form the 123 phase. This slow cooling rate yields very large grains with typical dimensions on the order of millimeters. If the cooling rate however, is increased to about 5° C./hr, then the grain size is only on the order of tens of microns. Large grain samples of the 123 superconductor have useful levitation properties for applications such as flywheels and low friction bearings, whereas small grain samples with grain sizes of tens of microns do not. Further, some RE123 superconductors (e.g. Y123) if cooled too rapidly from above the melting point, will contain little or no RE123 after the cooling. Thus, there is a preference for using the slower cooling rate. The downside, of course, is that fabrication time is increased.

In light of the above it is an object of the present invention to provide a melt processing method for fabricating a high temperature RE123 superconductor which can be completely accomplished at temperatures below the melting point of silver. It is another object of the present invention to provide a melt processing method for fabricating a high temperature RE123 superconductor which can be relatively rapidly accomplished. Yet another object of the present invention is to provide a melt processing method for fabricating a high temperature RE123 superconductor, in bulk. Still another object of the present invention is to provide a melt processing method for fabricating a high temperature RE123 superconductor which is relatively easy to employ and comparatively cost effective.

SUMMARY OF THE INVENTION

In accordance with the present invention, a melt processing method is provided which allows for the rapid processing of a RE123 superconductor material at temperatures which do not exceed the melting point of silver. Thus, the advantages of the present invention are essentially two-fold. First, the melt processing can be effectively accomplished in a shorter period of time. Second, the entire process can be conducted below the melting point of silver.

For the present invention, the advantage obtained due to an increase in the recrystallization speed of the RE123 superconductor material is made possible by at least two factors. These factors are: 1) using Nd in the RE123 superconductor material, and 2) adding an RE211 component to the RE123 before it is heated above its peritectic melting point.

The advantage of the present invention of melt processing below the melting point of silver also stems from several factors. Most importantly, the melt processing method of the present invention requires use of a low melting point (heavy) rare earth RE123 such as Lu123, Yb123, Tm123, Er123 or combinations thereof. (We have found that the Literature claim of a melting point of Yb123 of 1190° C. to be incorrect.) Other factors which have been shown to help reduce the temperature necessary for melt processing the RE123 include: 1) adding an RE211 component to the material to be melt processed; 2) adding silver to the material to be melt processed; and 3) using a reduced oxygen partial pressure which is less than one atmosphere. All of these factors will, when appropriately used, also contribute to the reduction of the melting point of the RE123.

In light of the above, the melt processing method of the present invention for rapidly fabricating a high temperature RE123 superconductor at temperatures below the melting point of silver begins by first preparing a composition of the material to be melt processed. Preferably, as indicated above, the quantity of RE123 composition material to be melt processed includes both Nd and a heavy rare earth. More specifically, a preferred composition for the material comprises a first component of $Nd_{1-z}R_z123$, where z is between 1.0 and approximately 0.7, and a second component of $Nd_{1-y}R_y211$, where y is between 1.0 and approximately 0.7. Of course when Z=1.0, the material can be melt processed below the melting point of silver, but not at the more rapid rate that the presence of Nd would allow. For both the first component and the second component, R is a heavy rare earth selected from the group consisting of Lu, Yb, Tm or Er, and the molar ratio of the first component to the second component is in a range of from 1:0.0 to approximately 1:0.4.

Once the RE123 composition material has been prepared, it is heated into a temperature range which is above the peritectic melting point of the RE123 but below the melting point of silver. For typical compositions of the RE123 superconductor material to be fabricated according to the method of the present invention, this temperature will be approximately, 930°–950° C. The RE123 material is then kept at this temperature until it decomposes into a solid phase containing RE211 and a liquid phase containing Ba-Cu. Following this decomposition, the RE211 phase and Ba-Cu phase are cooled together to recrystallize and fabricate the RE123.

Importantly, due to the Nd in the RE123 and the presence of RE211, the cooling of the RE211 solid phase and the Ba-Cu liquid phase is accomplished at a relatively rapid rate. Specifically, depending on the particular composition of the initial mixture, the cooling rate can be somewhere between 5° C./hr and 100° C./min. If Nd is not present, then the preferred cooling rate is between about 1° C./hr and about 60° C./hr.

In accordance with the present invention, the above described melt: processing method is to be accomplished below the melting point of silver. Consequently, the initial RE123 composition can be placed in the lumen of a tube comprising silver and processed in situ. Alternatively, the initial RE123 composition can be placed on a substrate comprising silver and processed in situ. Of course, the resultant melt processed material must then be oxygenated at, for example, a temperature of 400°–500° C. in one atmosphere of $O_2$ for about 1 day to yield a material with a superconducting transition temperature $T_c$ of about 90K. The oxygenation step is well known in the art.

The novel features of this invention, as well as the invention itself, both as to its structure and its operation will be best understood from the accompanying drawings, taken in conjunction with the accompanying description, in which:

DESCRIPTION OF THE PREFERRED EMBODIMENTS

The methods for fabricating a high temperature RE123 superconductor in accordance with the present invention are set forth in following examples.

EXAMPLE 1

A number of compositions of Yb containing 123 superconductor powder were prepared by standard calcining procedures. The appropriate amounts of $Yb_2O_3$, $BaCO_3$, CUO, Ag and Pt were mixed together prior to calcining. The peritectic decomposition (melting) temperatures of these powders in an atmosphere of 2% $O_2$/98% $N_2$ were determined by standard differential thermal analysis (DTA) tests. The results are shown in the table below. All DTA results discussed in this specification are taken at one atmosphere total pressure. The results indicate that, for example, Yb123+0.15Yb211+10% Ag+1% Pt melts at a temperature significantly below that of Ag, which is 960° C. in air and lower in temperature at higher oxygen partial pressures and higher in temperature at lower oxygen partial pressures. In this specification, 10%Ag (1% Pt) means that 10% (1%) of the total weight of this composition is Ag (Pt).

| Composition | DTA Heating Rate (C./min) | Atmosphere | DTA Endotherm onset (C.) 920 | DTA Endotherm midpoint (C.) 962 | Baseline/slope intercept (C.) |
|---|---|---|---|---|---|
| Yb123 | 10 | 2% $O_2$/98% $N_2$ | 920 | 962 | 939 |
| Yb123 | 1 | 2% $O_2$/98% $N_2$ | 929 | 945 | 934 |
| Yb123 + 0.15Yb211 + 1% Pt | 10 | 2% $O_2$/98% $N_2$ | 900 | 967 | 936 |
| Yb123 + 0.15Yb211 + 1% Pt | 1 | 2% $O_2$/98% $N_2$ | 880 | 945 | 896 |
| Yb123 + 0.15Yb211 + 10% Ag + 1% Pt | 10 | 2% $O_2$/98% $N_2$ | 873 | 951 | 931 |
| Yb123 + 0.15Yb211 + 10% Ag + 1% Pt | 1 | 2% $O_2$/98% $N_2$ | 859 | 927 | 877 |

Figure 1:
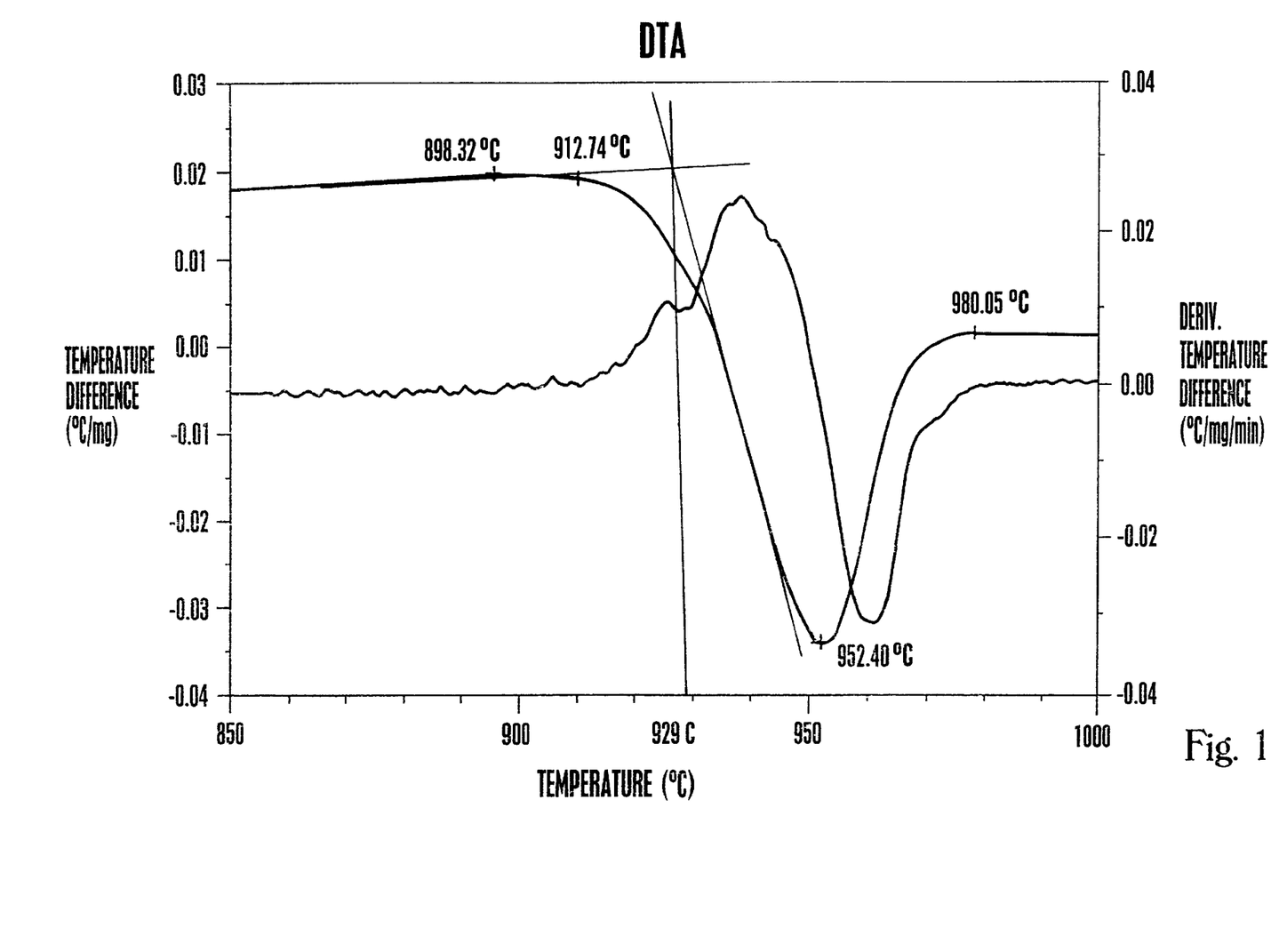
FIG. 1 is a graphical showing of the method for calculating the RE123 material melting point.

The melting point is generally considered to begin near the DTA endotherm onset temperature (912° C. in the example of FIG. 1) and end near the DTA midpoint temperature (deepest part of the endotherm), 952° C. in FIG. 1. The single temperature melting point is generally determined from the intersection of the baseline DTA curve prior to the onset of melting with the DTA line extrapolated from the steepest slope of the DTA endotherm, which occurs at 929° C. as shown in FIG. 1.

EXAMPLE 2

A number of compositions of Nd doped Yb123 superconductor plus silver and platinum powder were prepared by standard calcining procedures. The powders were mixed together prior to calcining. The peritectic decomposition (melting) temperatures of these powders in air were determined by DTA. The results are shown in the table below.

| Composition $(Yb_{1-x}Nd_x)$ 123 + 0.15 $(Yb_{1-x}Nd_x)$ + Y%Ag + 1%Pt | DTA Heating Rate (C./min) | Atmosphere | DTA Endotherm Onset (C.) | DTA Endotherm Midpoint (C.) | Baseline/slope intercept (C.) |
|---|---|---|---|---|---|
| x = 0; Y = 10 | 10 | Air | 912 | 954 | 931 |
| x = 0.05; Y = 10 | 10 | Air | 914 | 963 | 935 |
| x = 0.1; Y = 10 | 10 | Air | 915 | 968 | 946 |
| x-0.2 Y = 10 | 10 | Air | 915 | 980 | 957 |
| x = 0 Y = 0 | 10 | Air | 930 | 981 | 942 |
| x = 0.1 Y = 0 | 10 | Air | 931 | 999 | 954 |
| x = 0.3 Y = 0 | 10 | Air | 975 | 1020 | 1001 |
| x = 0.5 Y = 0 | 10 | Air | 985 | 1046 | 1009 |

These data indicate that small amounts of Nd can be substituted for Yb and the melting point can still be maintained below the melting point of silver. In a lower oxygen partial pressure environment, such as 2% $O_2$/98% $N_2$, the melting point is suppressed by about 30° C. compared to air, allowing an even larger temperature difference between the melting point of the compositions above and silver.

EXAMPLE 3

Different amounts of silver powder were mixed with calcined Yb123 powder. The results are shown in the table below.

| Composition | DTA Heating Rate (C./min) | Atmosphere | DTA Endotherm Onset (C.) | DTA Midpoint (C.) |
|---|---|---|---|---|
| Yb123 | 10 | Air | 950 | 989 |
| Yb123 + 5 weight % Ag | 10 | Air | 900 | 946 |
| Yb123 + 15 weight % Ag | 10 | Air | 901 | 954 |
| Yb123 + 25 weight % Ag | 10 | Air | 900 | 954 |

It is evident that Yb123 with silver additions melts significantly below the melting point of silver.

EXAMPLE 4

Powders of Yb123+0.4 Yb211 and of Nd123+0.4 Nd211 were prepared using standard calcining procedures. These 2 powders were then mixed in certain proportions and then pressed into a pellet. The pellets were melted by heating them to 1115° C. in air on polycrystalline MgO substrates and then pulled out of the furnace and quenched in air. The resulting pellets were then examined by X-ray diffraction and by EDAX (Energy Dispersive Analysis of X-rays) in the Scanning Electron Microscope (SEM).

| Molar % Yb123 + 0.4Yb211 | Molar % Nd123 + 0.4Nd211 | Phases present from X-ray diffraction | Phases present from SEM/EDAX |
|---|---|---|---|
| 100 | 0 | 211,BaCuO$_2$,no 123 | 3 micron 211 grains; Remainder is Ba-Cu phases. |
| 90 | 10 | 211, BaCuO$_2$, small amount of 123 | |
| 70 | 30 | 211,123, small amount of BaCuO$_2$ | 5 micron 211 grains in 123; Some Ba-Cu regions |
| 50 | 50 | 211,123,no BaCuO$_2$ | 5 micron 211 in 123; Small amount of Ba-Cu regions. |
| 0 | 100 | 123,211 | 5 micron 211 grains in 123; No Ba-Cu regions. |

Increasing amounts of Nd123+0.4Nd211 clearly yields material with increasing amounts of desirable 123 superconductor and reduces the amount of undesirable Ba-Cu-O phases. The 50—50 composition consisted of less than about 3% BaCu O$_2$ phase, since this is about the limit of detection for this phase as determined by X-ray diffraction.

EXAMPLE 5

Figure 2:
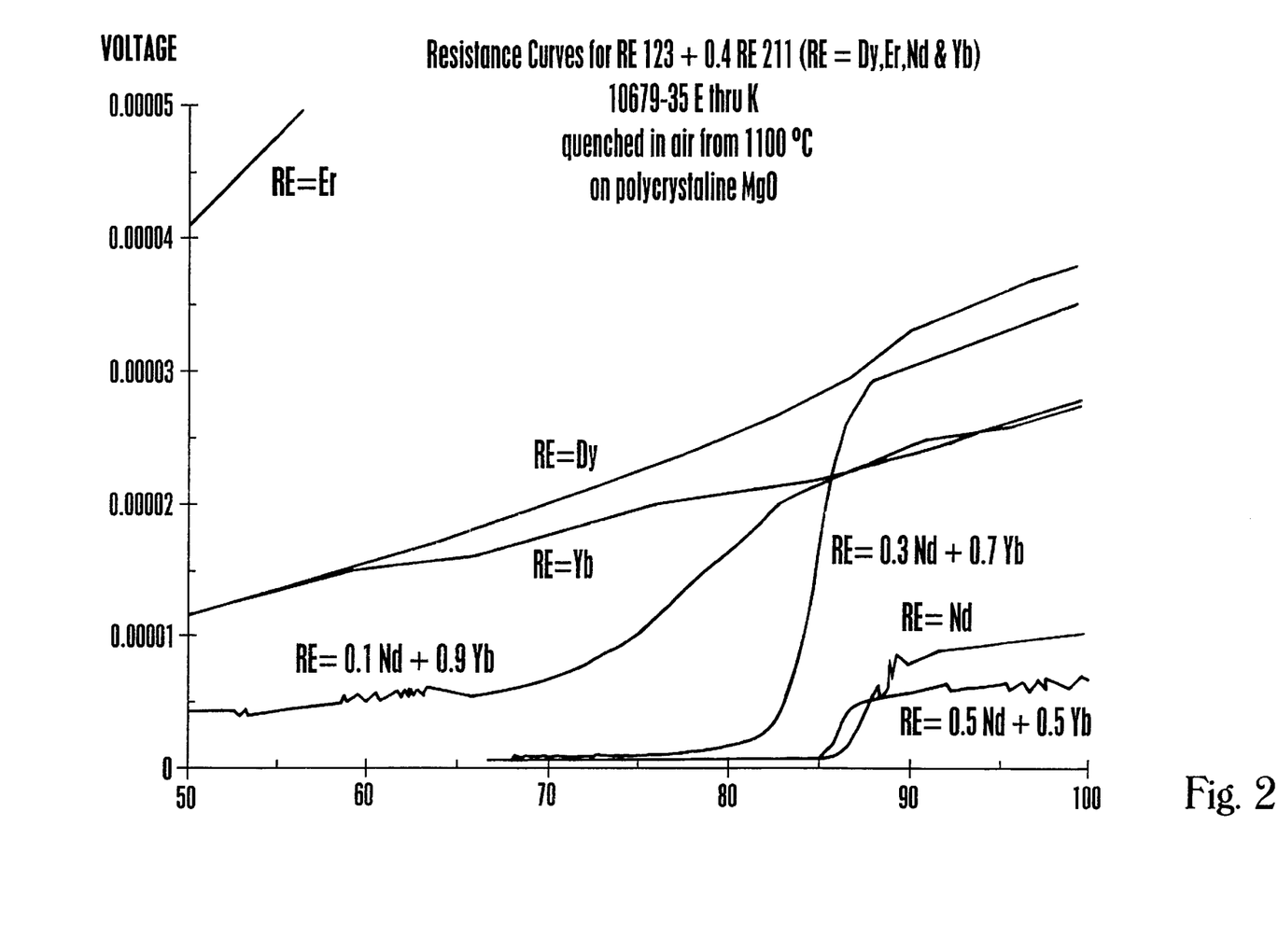
FIG. 2 is a graph depicting resistance versus temperature.

Pellets of RE 123+0.4RE211, where RE=Nd, Er, Dy, Yb, 0.1Nd+0.9Yb, 0.3Nd+0.7Yb, and 0.5Nd+0.5Yb were prepared. These pellets were melted by heating in air to 1100° C. on polycrystalline MgO substrates and then quenched by taking them out of the oven and letting them cool in air. (They cooled to ~700° C. in about 20 seconds.) Resistance versus temperature curves are shown in FIG. 2. These data indicate that the RE=Dy, Er and Yb pellets do not exhibit any traces of superconducting behavior. In contrast, the RE=Nd and 0.5Nd+0.5Yb pellets exhibited fully superconducting behavior at 85K. The slightly lower Nd content pellet with RE=0.3Nd+0.7 Yb exhibits fully superconducting behavior at a lower temperature of 75K. The even lower Nd content pellet with RE=0.1Nd+0.9Yb exhibited a partial transition to the superconducting state as evidenced by a drop in the resistance at 80K, although the sample did not exhibit fully superconducting behavior as evidenced by its attainment of zero resistance.

EXAMPLE 6

Powders were prepared using standard calcining techniques or by mixing, as noted in the table below. The melting points were determined by DTA.

| Composition | DTA Heating Rate (C./min) | Atmosphere | DTA Endotherm Onset Temperature (C.) | DTA Midpoint Temperature (C.) |
|---|---|---|---|---|
| Ag | 10 | Air | 946 | 961 |
| Ag | 10 | N$_2$ | 955 | 968 |
| Ag$_{.93}$Pt$_{.07}$ | 10 | N$_2$ | 973 | 992 |
| Yb123 + 0.4Yb211 | 10 | Air | 940 | 972 |
| Yb123 + 0.4Yb211 | 10 | N$_2$ | 912 | 929 |
| Yb123 + 0.4Yb211 + 10% Ag | 10 | N$_2$ | 892 | 908 |
| Yb123 | 10 | Air | 948 | 982 |
| Yb123 + 10% Ag | 10 | Air | 920 | 946 |
| Yb123 + 0.4Yb211 mixed with 10% Ag | 10 | Air | 903 | 936 |
| Yb123 + 0.4Yb211 mixed with 10% Ag | 10 | N$_2$ | 894 | 910 |
| Er123 + 0.4Er211 | 10 | O$_2$ | 975 | 1024 |
| Er123 + 0.4Er211 | 10 | Air | 955 | 1007 |
| Er123 + 0.4Er211 | 10 | N$_2$ | 900 | 950 |
| Er123 + 0.4Er211 + 17% Ag | 10 | N$_2$ | 900 | 930 |

As is well known in the art, melt processing of the RE123 superconductor must be performed in at least a small oxygen partial pressure. The DTA results for the melting behavior in N$_2$ gas indicate a lower limit for the melting point of that particular composition. The results clearly indicate that the melting point can be reduced below that of silver by the combination of using Yb for the rare earth element, adding Yb211, adding silver, and/or using a low oxygen partial pressure, as exemplified by the N$_2$ gas atmosphere. The results also indicate that using Er for the rare earth element can also yield a melting point less than that of silver. We have found that the melting point of the RE123 superconductor decreases as the RE element becomes heavier. Thus, Tm123 and Lu123 should also be able to be melt processed below the melting point of silver. However, the cost of Tm and Lu starting materials, such as oxides or nitrates, is considerably higher than that of Yb and Er, rendering them much less economically viable for large scale applications.

EXAMPLE 7

Pellets of compositions listed below were melt processed by heating to 1130° C. for 10 min in air, and then pulling the samples out of the oven and cooling them in air. Following this process, the pellets were oxygenated in a flowing atmosphere of 760 torr oxygen at 500° C. for 16 hours, followed by 450° C. for 16–24 hours, followed by 20–200 hours at 400° C.

| Composition | Platform | T$_c$ onset (K) | T$_{co}$ (K) |
|---|---|---|---|
| Nd123 + 0.4Nd211 | MgO | 92 | 90 |
| Nd123 + 0.4Nd211 + 1% Pt | MgO | 96 | 90 |
| Nd123 + 0.4Nd211 | Pt | 95 | 91 |

EXAMPLE 8

Powders were prepared using standard calcining techniques to examine the effect of small amounts of silver addition to the melting point of Yb123 as shown in the table below.

| Composition | DTA Heating Rate (C./min) | DTA Atmosphere | DTA Melting Endotherm Onset Temperature (C.) | DTA Midpoint Endotherm Temperature (C.) | DTA Melting Point Using Baseline/ Slope Intercept (C.) |
|---|---|---|---|---|---|
| Yb123 + 0.4Yb211 | 10 | Air | 948 | 972 | 953 |
| Yb123 + 0.4Yb211 + 1.1% Ag | 10 | Air | 920 | 969 | 935 |
| Yb123 + 0.4Yb211 + 2.2% Ag | 10 | Air | 910 | 962 | 926 |
| Yb123 + 0.4Yb211 + 5% Ag | 10 | Air | 918 | 946 | 922 |
| Yb123 + 0.4Yb211 + 10% Ag | 10 | Air | 890 | 936 | 908 |
| Ag | 10 | Air | 946 | 961 | 952 |

The presence of even small amounts of silver is seen to substantially reduce the melting point of Yb123+0.4Yb211 to below that of silver.

EXAMPLE 9

Figure 3:
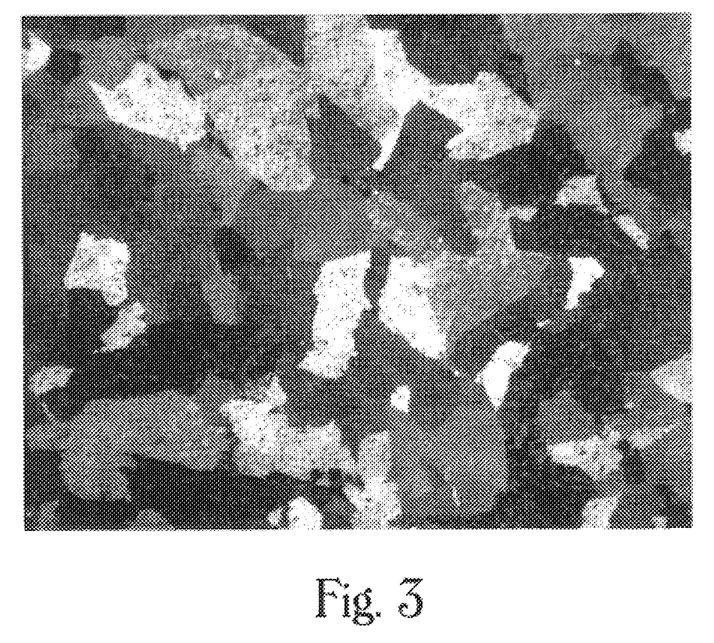
FIG. 3 is a polarized light metallograph showing grains of a 123 superconductor with typical sizes of approximately 50 microns.

A pellet of Nd123+0.4Nd211 was heated above its peritectic decomposition temperature to 1130° C. in air on a nonreactive single crystal MgO substrate. The pellet was quenched by removing it from the furnace, corresponding to a cooling rate of greater than 200° C./min. A polarized light metallograph shown in FIG. 3 indicates that the material has a melt-textured type of microstructure consisting of ~50 micron diameter grains of 123 superconductor.

Figure 4:
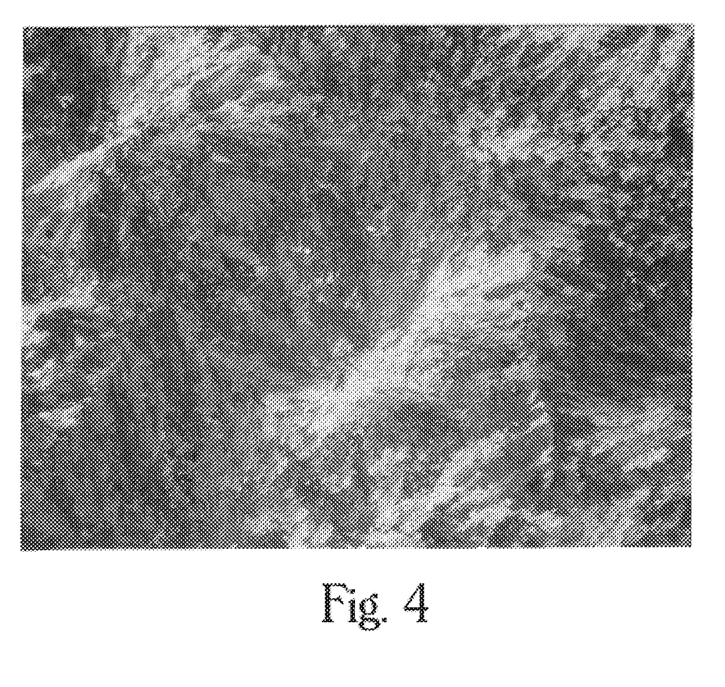
FIG. 4 is a polarized light micrograph showing grains which were cooled too rapidly to form a melt textured type microstructure.
Figure 5:
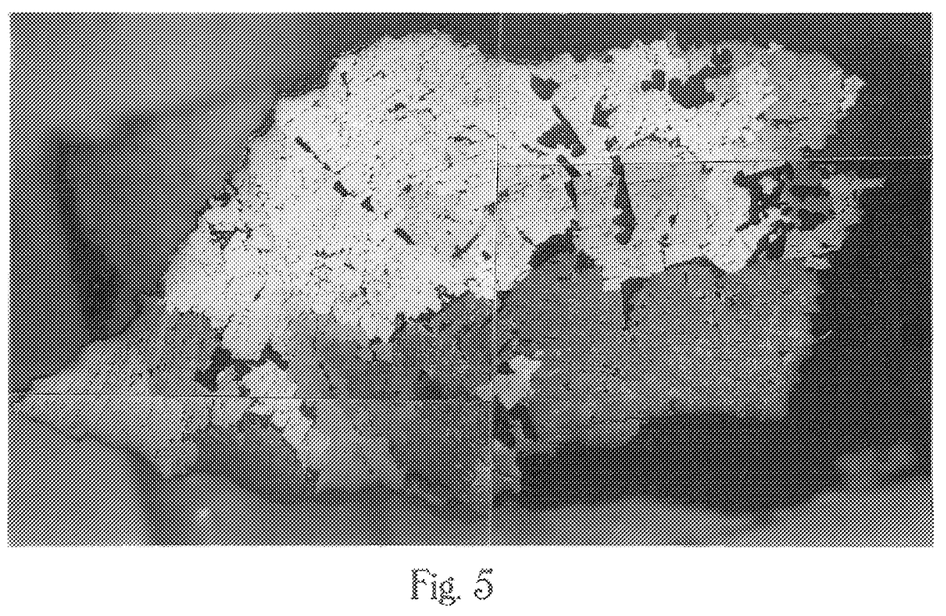
FIG. 5 is a polarized light micrograph which shows RE123 superconductor of approximately 100 micron grain size that have a melt textured type microstructure.

Two pellets of Dy123+0.4Dy211+1% Pt were heated above their peritectic decomposition temperature to 1080° C. in air. One pellet was then cooled at 10° C./min to 900° C. and then furnace cooled to room temperature. A polarized light micrograph of FIG. 4 indicates that the grain structure does not have the melt textured type appearance indicating that this cooling rate is too rapid to form a melt textured type of microstructure. The second pellet was cooled at 1° C./min to 900° C. and then furnace cooled to room temperature. The polarized light micrograph of FIG. 5 shows a melt textured type microstructure, similar to that of FIG. 3, but with ~100 micron diameter grains of 123.

EXAMPLE 10

Figure 6:
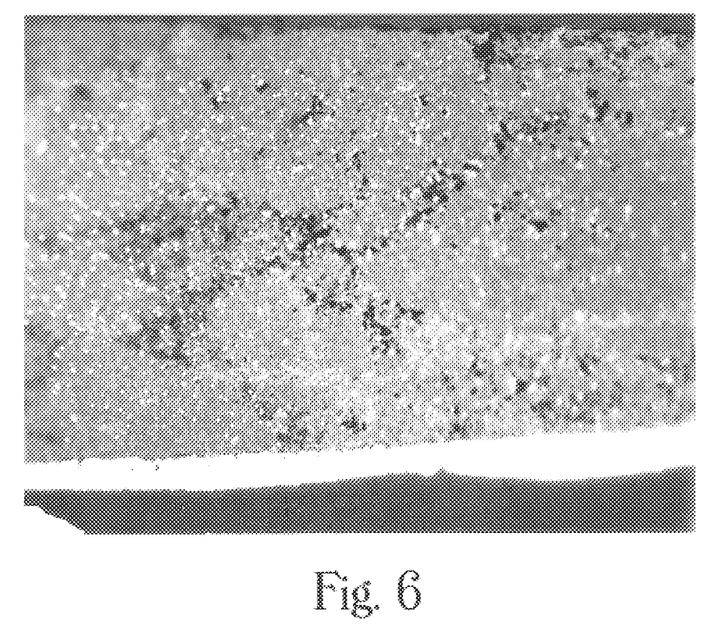
FIG. 6 is a polarized light micrograph of a RE123 superconductor which was heated up to 901° C. during melt processing.
Figure 7:
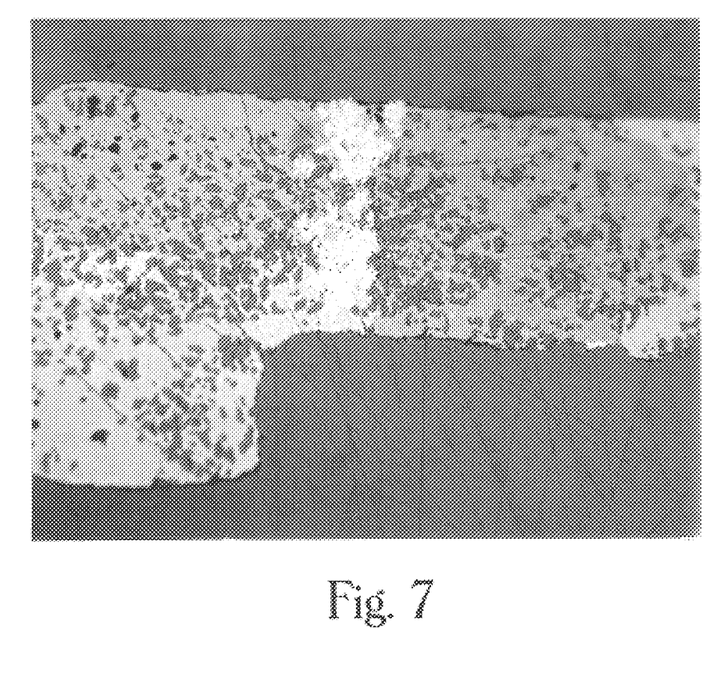
FIG. 7 is a polarized light micrograph of a RE123 superconductor which was heated up to 936° C. during melt processing.
Figure 8:
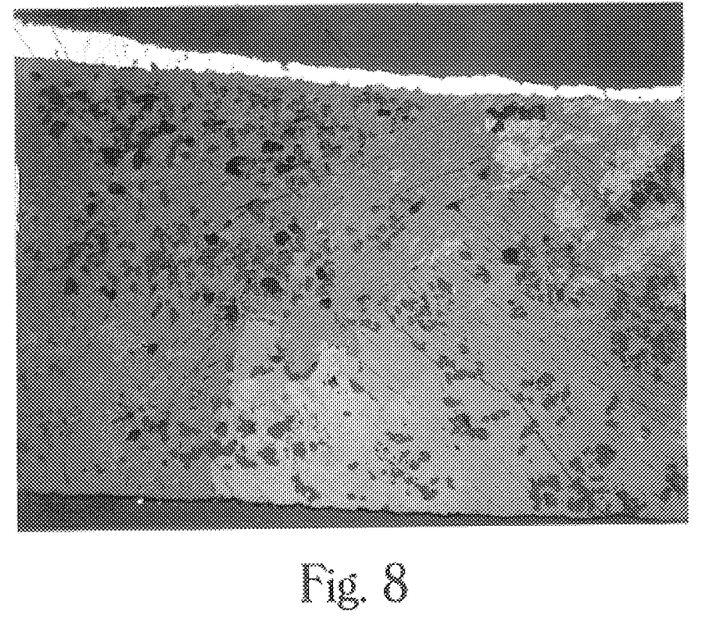
FIG. 8 is a polarized light micrograph of a 123 superconductor which was heated up to 1020° C. during melt processing.

Three pellets of Yb123+0.15Yb211+10% Ag+1% Pt were prepared. One was heated to 901° C., one to 936° C., and one to 1020° C. in a reduced oxygen partial pressure of 15 torr on single crystal MgO platforms. They were held at that temperature for 30 minutes and then cooled down to 800° C. at a rate of 18° C./hr. Polarized light metallographs are shown as FIG. 6, 7 and 8 respectively. The pellet heated to 901° C. (FIG. 6) exhibited a fine grained sintered microstructure, indicating that 901° C. is below the melting point of the material. Both the pellet heated to 936° C. (FIG. 7) and the pellet heated to 1020C (FIG. 8) exhibited similar melt textured microstructures with grain sizes of ~125 microns. This indicates that the melting point is below 936° C., consistent with the DTA results of Example 1.

EXAMPLE 11

Figure 9:
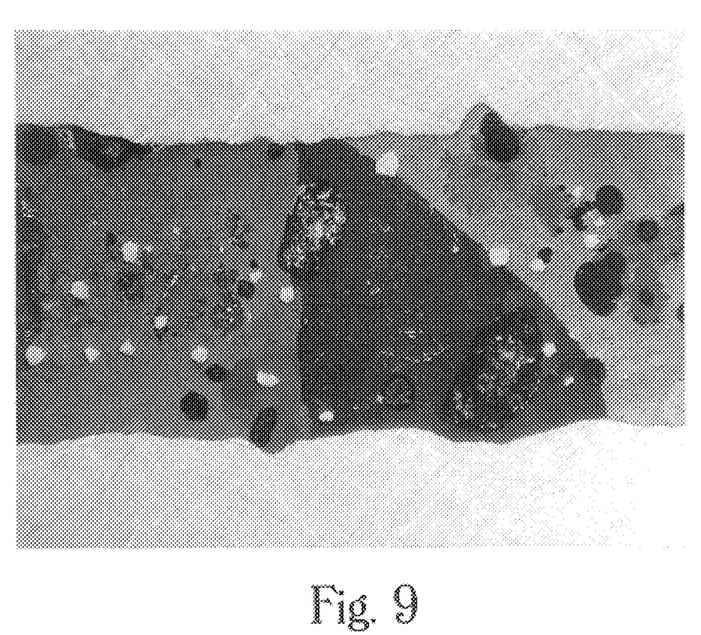
FIG. 9 is a polarized light micrograph of an axial cross section of silver tubing with melt processed 123 superconductor material in the lumen.

A silver tube of dimensions 6.35 mm outer diameter and 4.35 mm inner diameter was filled with powder of composition Yb123+0.1Yb211+10% Ag. The tube was drawn through a series of dies using conventional processes until the outer diameter reached 4.28 mm. At this point, the tube was heat treated at 900° C. for 48 hours in an atmosphere of 2% $O_2$/98% $N_2$. This intermediate heat treatment yielded a denser final product than a comparable sample that did not undergo this heat treatment. The tube was then further drawn down to 1.83 mm O.D. and melt processed at 940° C. for 24 hours in an atmosphere of 2% $O_2$/98% $N_2$. It was then cooled at a rate of 1° C./hr to 810° C. and then furnace cooled to room temperature. It was then oxygenated in 1 atmosphere of oxygen at 800° C. for 6 hours, then 750° C. for 6 hours, then 700° C. for 12 hours, then 650° C. for 24 hours, then 600° C. for 54 hours, then 550° C. for 80 hours, then 500° C. for 61 hours. This oxygenation procedure was determined using the known oxygen diffusion rates in silver and oxygen solubility in silver as a function of temperature and the temperature dependence of the oxygen solubility in the 123 superconductor in order to minimize the time needed to oxygenate the superconductor core via oxygen diffusion through the silver tube. A polarized light micrograph of an axial cross section of the wire is shown in FIG. 9. It shows the large ~1 mm grains typical of melt textured material, indicating that this composition can be melt processed below the melting point of silver.

EXAMPLE 12

Figure 10:
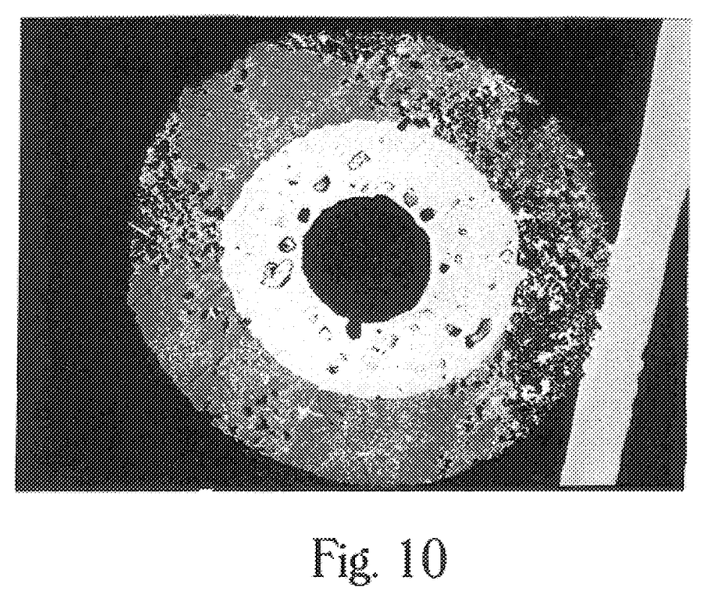
FIG. 10 is a scanning electron micrograph of a radial cross section of melt processed RE123 on a silver coated Haynes 214 substrate.
Figure 11:
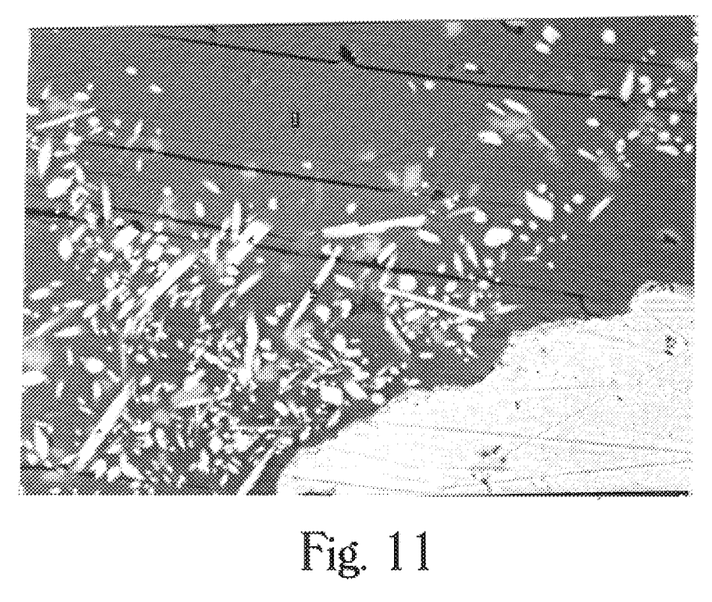
FIG. 11 is a higher magnification photo of a region shown in FIG. 10.

A Haynes 214 wire was continuously electrophoretically coated with silver and then the silver was sintered at ~920° C. and then electrophoretically coated with Yb123+ 0.15Yb211+10% Ag+1% Pt and sintered at ~850° C. using a process described in U.S. Pat. No. 5,118,663. The coated wire was then melt processed by heating it on a single crystal MgO substrate at 940° C. for 5 min. in 15 torr oxygen partial pressure and then cooling at 18° C./hr. to 800° C. and then furnace cooling to room temperature. A scanning electron micrograph of a polished radial cross section of the wire is shown in FIG. 10. Large regions of ~100 microns of melt textured material are evident. A higher magnification photograph of the melt textured region is shown in FIG. 11 near the silver/superconductor interface showing the presence of well aligned grains of 123 superconductor with 211 and Ag particles interspersed throughout the 123.

EXAMPLE 13

Figure 12:
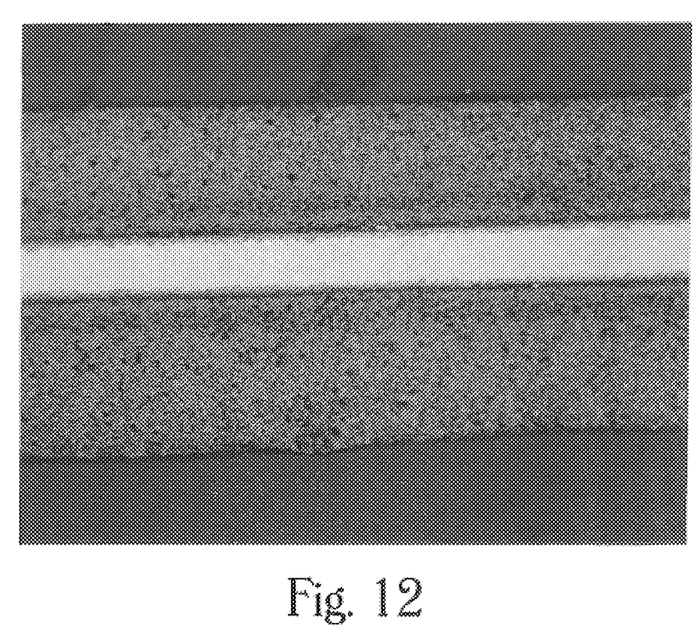
FIG. 12 is a polarized light micrograph of an axial cross section of a melt processed 123 superconductor material on a Duranickel 301 substrate wire which was heated up to a temperature of 1107° C.
Figure 13:
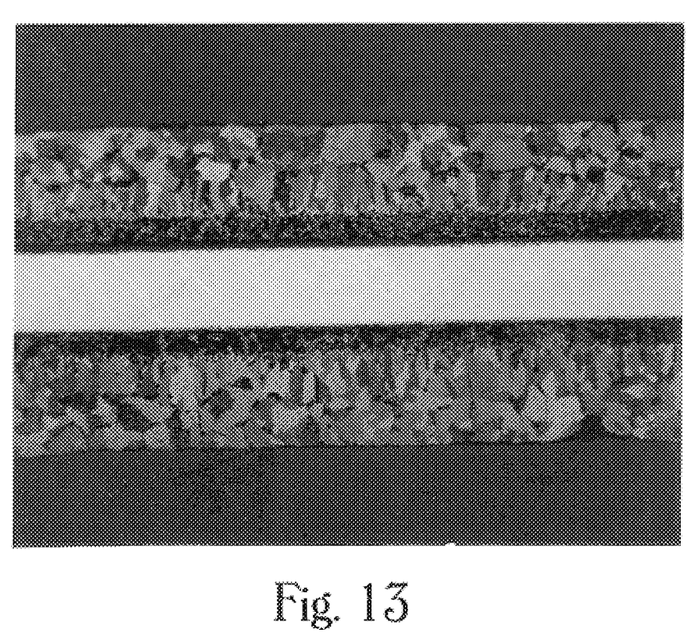
FIG. 13 is a polarized light micrograph of an axial cross section of a melt processed 123 superconductor material on a Duranickel 301 substrate wire which was heated up to a temperature of 1117° C.

A Duranickel 301 wire was continuously electrophoretically coated at 22 in./min. with Nd123+0.4Nd211 and then the coating was melted in an oxygen atmosphere when it passed through an 8 in long furnace set at 1107° C. A second experiment was performed with the furnace set at 1117° C. The process used is described in U.S. Pat. No. 5,118,663. A polarized light micrograph of an axial cross section of these coated wires is shown in FIG. 12 and 13 respectively. The actual temperature of the coating is expected to be less than the set temperature of the furnace due to the small size of the furnace and the rapid speed of the wire through the furnace. The actual temperature seen by the coating at the set temperature 1107° C. is apparently less than the melting point of the coating since the coating consists of a fine grained sintered microstructure. The actual temperature seen by the coating at the set temperature of 1117° C. is apparently above the melting point of the coating since the coating now consists of ~25 micron grains of 123 superconductor.

This indicates that this composition can be rapidly melted and then rapidly recrystallized.

EXAMPLE 14

A pellet of Nd123+0.4Nd211 was melted in air by heating to 1150° C. for 10 min. and then rapidly cooled to 1090° C., just above its peritectic decomposition temperature, and then cooled at 5° C./hr to 1000° C. Metallography indicated that the grain size of this material ranged from 2–4 mm, more than a factor of 10 larger than would be expected if Y123 had been used.

EXAMPLE 15

Figure 14:
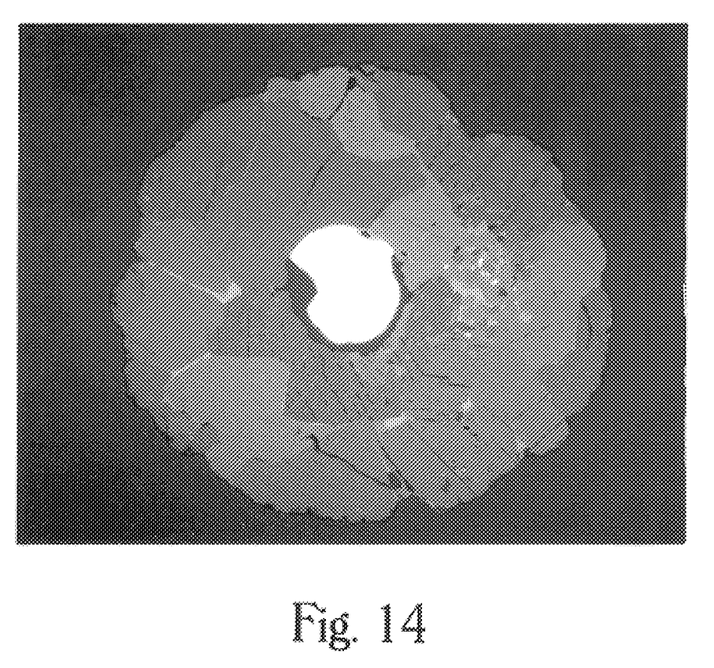
FIG. 14 is a polarized light micrograph of a radial cross section of a 123 superconductor material melt processed on a silver wire substrate.

A slurry of Yb123+0.15 Yb211 was prepared and used to electrophoretically coat a silver wire, using the process described in U.S. Pat. No. 5,118,663. The coated wire was suspended in a furnace and then melt processed in an atmosphere of 15 torr partial pressure of oxygen by heating to 945° C., holding at that temperature for 30 minutes, then cooling to 845° C. at a rate of 2° C./hr. At this point, the 123 material is solidified. The atmosphere was then switched to 1 atmosphere of oxygen, the sample cooled at 60° C./hr to 500° C. and then held at 500° for 24 hrs. A polarized light micrograph of a radial cross section of this material is shown in FIG. 14, and demonstrates a melt processed type of microstructure.

We note that it is not necessary that the 123 or 211 phases be formed prior to the melt processing. For example instead of melt processing Nd123+0.4 Nd211, containing the ratio of 1.8 moles of Nd, 2.4 moles of Ba and 3.4 moles of Cu, the composition Nd211+Ba-Cu-O could be used where the ratio of Nd to Ba to Cu is 1.8 to 2.4 to 3.4. It is the overall cation stoichiometry of the material that is critical.

While the particular melt processing methods for rapidly fabricating a high temperature RE123 superconductor below the melting point of silver as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

I claim:

1. A method for fabricating a high temperature RE 123 superconductor, comprising the steps of:
   preparing a quantity of oxide material including a first component of $Nd_{1-z}R_z 123$ and a second component of $Nd_{1-y}R_y 211$;
   heating said quantity of material to a first temperature above the peritectic decomposition temperature of said first component, thereby decomposing said first component; and then
   cooling said quantity of material from said first temperature to a temperature below the peritectic decomposition temperature of said first component at a cooling rate greater than 5° C./hr, thereby recrystallizing said quantity of material into a high temperature RE123 superconductor with grains having at least one dimension being approximately one millimeter.

2. The method as recited in claim 1 wherein z is between 0 and approximately 0.9 and y is between 0 and approximately 0.9 and wherein the molar ratio of said first component to said second component is in a range of from 1:0.0 to approximately 1:0.4.

3. The method as recited in claim 1 further comprising the step of combining silver with said quantity of material prior to said heating step.

4. The method as recited in claim 1 further comprising the step of placing said quantity of material in the lumen of a tube before said heating step, said tube being made of a material including silver.

5. The method as recited in claim 1 further comprising the step of depositing said quantity of material on a substrate before said heating step, said substrate being made of a material including silver.

6. The method as recited in claim 1 wherein said cooling rate is greater than approximately 200° C./hr.

7. The method as recited in claim 1 further comprising the step of accomplishing said heating step and said cooling step in an oxygen partial pressure of less than one atmosphere.

* * * * *